United States Patent [19]

Cook et al.

[11] Patent Number: 4,654,119
[45] Date of Patent: Mar. 31, 1987

[54] METHOD FOR MAKING SUBMICRON MASK OPENINGS USING SIDEWALL AND LIFT-OFF TECHNIQUES

[75] Inventors: Robert K. Cook, Poughkeepsie; Joseph F. Shepard, Hopewell Junction, both of N.Y.

[73] Assignee: International Business Machines Corporation, Armonk, N.Y.

[21] Appl. No.: 799,053

[22] Filed: Nov. 18, 1985

[51] Int. Cl.⁴ .......................................... H01L 21/306
[52] U.S. Cl. ................................. 156/649; 29/576 R; 29/576 J; 156/632; 156/638; 156/643; 156/653; 156/657
[58] Field of Search ............... 156/643, 644, 653, 657, 156/629, 632, 633, 638, 649; 29/576 R, 576 J, 578

[56]  References Cited
U.S. PATENT DOCUMENTS

| 3,982,943 | 9/1976 | Feng et al. | 96/38.4 |
| 4,209,349 | 6/1980 | Ho et al. | 148/187 |
| 4,274,909 | 6/1981 | Venkataraman et al. | 156/648 |
| 4,387,145 | 6/1983 | Lehrer et al. | 156/653 X |
| 4,430,791 | 2/1984 | Dockerty | 29/571 |
| 4,563,241 | 1/1986 | Tanaka et al. | 156/643 |
| 4,572,765 | 2/1986 | Berry | 156/643 |
| 4,575,924 | 3/1986 | Reed et al. | 29/576 R |

OTHER PUBLICATIONS

IBM Technical Disclosure Bulletin, by R. P. Each et al, "Obtaining Evaporated Metal Patterns on Substrates," vol. 9, No. 4, Sep. 1966, pp. 348–349.

Primary Examiner—Robert Lindsay
Attorney, Agent, or Firm—Robert J. Haase

[57] ABSTRACT

A method is disclosed for making submicron openings in a substrate. A mesa is formed on the substrate by reactive ion etching techniques. A film is deposited over the entire structure and the mesa is selectively etched away to yield a submicron-sized opening in the film. Using the film as a mask, the substrate exposed thereby is reactively ion etched. An example is given for producing an emitter mask for a polycrystalline silicon base bipolar transistor.

10 Claims, 4 Drawing Figures

METHOD FOR MAKING SUBMICRON MASK OPENINGS USING SIDEWALL AND LIFT-OFF TECHNIQUES

TECHNICAL FIELD

This invention generally relates to methods for making submicron mask openings and more particularly, to such a method characterized by the use of sidewall, reactive-ion etching and image reversal lift-off techniques.

BACKGROUND ART

Various forms of photolithography have been employed in the making of mask openings or lines used in very large scale integrated circuit manufacture. Very small mask openings for emitter and other diffusion steps or very thin metallization patterns for chip device interconnections, for example, have been fabricated using resist materials selectively exposed by E-beam, X-ray or ion-beam irradiation through a photographically defined pattern.

More recently, a new technique has evolved to avoid the inherent optical limitations in the selective exposure of resist materials, as the mask opening size or width of the desired line patterns is reduced to the order of one micron or less for very high density integrated circuits. The new technique eliminates the use of photolithography to define the cited dimensions and substitutes a sidewall, reactive-ion etching (RIE) process whereby the dimensions are determined by the thickness of a deposited layer which can be controlled with great accuracy.

One example wherein a sidewall RIE process is used to define a narrow line pattern structure (in this case the length of an FET gate electrode) is given in U.S. Pat. No. 4,430,791, issued on Feb. 14, 1984 to Robert C. Dockerty and assigned to the present assignee. An example wherein a sidewall RIE process is used to define a small mask opening is given in U.S. Pat. No. 4,209,349, issued on June 24, 1980 to Irving T. Ho et al. and assigned to the present assignee. With respect to the latter example, however, a thermal oxidation step is employed after the formation of a silicon nitride sidewall. The thermal oxidation tends to produce the well-known "bird's beak" beneath the nitride sidewall which can impact the precision of control of the resulting emitter window width when the nitride is subsequently removed. It would be advantageous to avoid the use of process steps tending to produce a "bird's beak" whereby the benefit of mask opening control inherent in the sidewall RIE process could be fully exploited without loss.

U.S. Pat. No. 4,274,909, issued on June 23, 1981 to K. Venkataraman et al. and assigned to the present assignee, teaches an alternative non-sidewall RIE process for making mask openings of the order of a micron or less. The process incorporates photoresist planarization and isotropic etching steps which are somewhat more difficult to control with precision than is the case with sidewall RIE.

SUMMARY OF THE INVENTION

Submicron mask openings suitable for use with substrates of various types, including non-oxidizable substrates, are produced by a sidewall reactive-ion etching process including image reversal lift-off processing steps. In an exemplary embodiment for making submicron emitter mask openings for polycrystalline silicon base transistors, a mesa of submicron width is formed on a substrate by sidewall-RIE technique. The substrate includes a layer of $P^+$-doped polycrystalline silicon material covered by silicon dioxide and silicon nitride layers. The substrate in turn, is formed over an $N^-$ epitaxial silicon layer in which a bipolar transistor is to be made. The mesa comprises an underlying layer of silicon dioxide covered by silicon nitride. The mesa silicon oxide layer is undercut by isotropic etching to provide a lift-off profile and magnesium oxide (MgO) or other suitable RIE masking material is then deposited over the structure as by evaporation. The remaining $SiO_2$ in the mesa support is etched away, lifting off the overlying $Si_3N_4$ and MgO layers to leave a submicron opening in the residual MgO film on the non-mesa areas of the structure. The substrate exposed through the opening is removed by further RIE to provide an emitter mask for the $N^-$ epitaxial layer of much smaller dimension and with significantly better dimensional control than is achievable using photolithographical methods.

BEST MODE FOR CARRYING OUT THE INVENTION

Although the method of the present invention is for the formation of submicron holes in a wide variety of materials, it will be described in the context of materials used in making a submicron emitter mask opening for a polycrystalline base bipolar transistor. A transistor of such type is well known in the art and is described, for example, in U.S. Pat. No. 4,252,582, issued on Feb. 24, 1981 and assigned to the present assignee. Briefly, the transistor is formed in an epitaxial layer deposited on a monocrystalline semiconductor body. A doped polycrystalline layer (to form at least part of the extrinsic base area by outdiffusion into the epitaxial layer and to provide electrical circuit connection to said extrinsic base) is deposited over the epitaxial layer. Eventually, an emitter is formed centrally within the extrinsic base.

Figure 1:
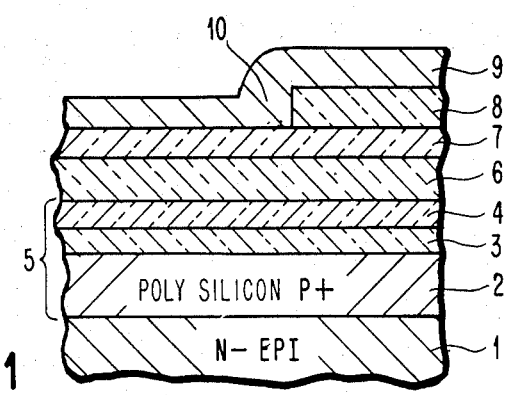
FIGS. 1-4 are simplified, cross-sectional views of the partial structures resulting at successive times during the execution of a preferred embodiment of the method of the present invention.

Referring to FIG. 1, an exemplary layered mask used in defining an emitter opening in a polycrystalline base transistor comprises $P^+$-doped polycrystalline layer 2, $SiO_2$ layer 3 and $Si_3N_4$ layer 4. The mask is formed on N epi layer 1 in which the transistor (not shown) is produced. Layers 2, 3 and 4 commonly are used in the fabrication of polycrystalline-base transistors but they form no necessary part of the present invention, in its broader aspect, other than to constitute a substrate 5 into which a submicron opening is to be made.

The width of the desired submicron opening is determined in accordance with the sidewall-reactive ion etching technique of the aforementioned U.S. Pat. No. 4,209,349 by which the closely controlled thickness of a layer or layers deposited on the surfaces of a stepped structure is reactively ion etched to remove all of the deposited layer except along the vertical surface (sidewall) of the stepped structure. Accordingly, $SiO_2$ layer 6, $Si_3N_4$ layer 7 and $SiO_2$ stepped structure 8 are formed on substrate 5. The entire structure is covered by polycrystalline silicon layer 9 and then reactively ion etched to remove the layer 9 from all horizontal surfaces leaving it only at the sidewall 10 of stepped structure 8. The steps carried out to this point generally correspond to those described in U.S. Pat. No. 4,209,349 although the specific materials employed differ somewhat.

At this point, departure is made from the technique of U.S. Pat. No. 4,209,349. Whereas in the patent the stepped structure is retained and the sidewall is removed to define an opening adjacent the stepped structure, the present invention provides for the converse, i.e., the sidewall is retained and the stepped structure is removed at this time. Thus, after the reactive ion etching step, the $SiO_2$ structure 8 is etched away leaving the sidewall 10 of polycrystalline silicon 9 standing alone as a mesa on top of $Si_3N_4$ layer 7. Using sidewall 10 as a mask, layers 6 and 7 are successively etched away (except where covered by sidewall 10) to yield the extended mesa structure 11 shown in FIG. 2.

In accordance with the present invention, structure 11 is used in a lift-off process to form a submicron opening in substrate 5 having the dimension and dimensional precision determined by the thickness of deposited layer 9 and without the use of any oxidation step (such as in U.S. Pat. No. 4,209,349) which would tend to form a "bird's beak" invading the sidewall structure and lessening the precision with which the width of the sidewall structure is maintained. This is achieved by first removing the polycrystalline silicon residue 10. Then, to assure ease of lift-off, the $SiO_2$ layer 6 of structure 11 preferably is undercut by use of a selective etchant and a layer 12 of a suitable lift-off material such as MgO or polysilicon is deposited (as by evaporation) over the structure. The undercut $SiO_2$ and the overlying $Si_3N_4$ 7 and MgO 12 are removed by use of an isotropic etchant that selectively attacks the $SiO_2$ layer 6 as is well understood in the lift-off processing art. The remaining MgO layer 12 then is used as a reactive ion etching mask for the successive removal of the exposed $Si_3N_4$, $SiO_2$ and polycrystaline silicon layers 4, 3 and 2, respectively, to yield the structure 13 shown in FIG. 4. Structure 13 is compatible with state-of-the-art polycrystalline silicon base transistors where P+ polycrystalline layer 2 of structure 13 provides a base contact to an extrinsic base region (not shown) which is formed by outdiffusion of dopant from layer 2 into epi 1 and the intrinsic base and emitter regions (also not shown) are produced by respective ion implantations through opening 14 in structure 13.

Figure 2:
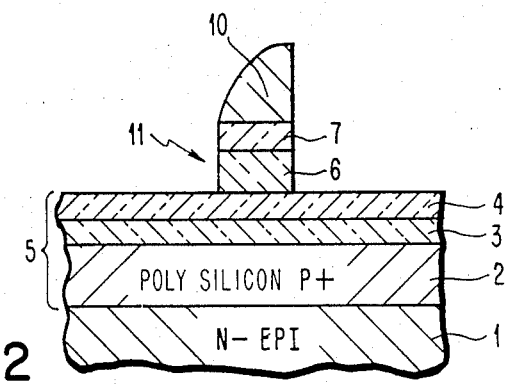
Figure 3:
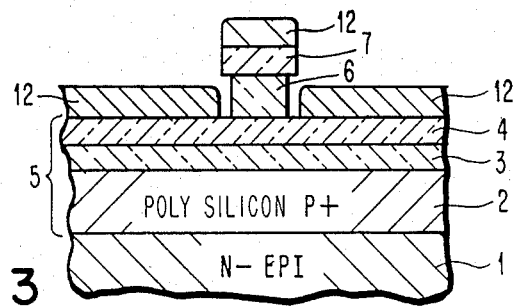
Figure 4:
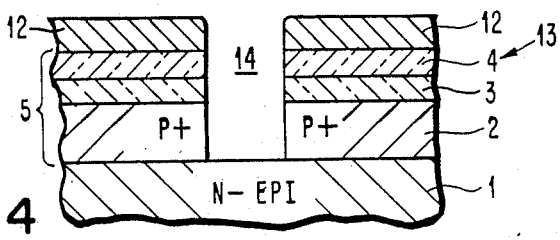

It will be noted that the details of the depositions made to produce the structure of FIG. 1, of the etchings to provide structure 11 of FIG. 2 and of the lift-off process to yield the final structure 13 of FIG. 4 have been alluded to in general terms only inasmuch as the individual respective processes are separately well understood in the art. Moreover, the identity of each individual layer used is of no critical moment to the practice of the present invention so long as compatibility with the other layers is maintained, consistent with the etching steps involved in fabricating the sidewall structure 11 of FIG. 2 and in producing the residual lift-off structure 13 of FIG. 4.

While the invention has been particularly shown and described with reference to the preferred embodiments thereof, it will be understood by those skilled in the art that various changes in form and detail may be made therein without departing from the spirit and scope of the invention.

We claim:

1. The method for making an opening in a substrate by selective etching, said method comprising
   forming by reactive ion etching sidewall technique a mesa on said substrate,
   depositing a film on the top of said substrate and on the top of said mesa but not on the sidewalls of said mesa,
   completely removing said mesa and said film on the top thereof by selectively attacking the sidewalls of said mesa but not said film so that said film remains on the top of said substrate solely at locations other than at said mesa, and
   selectively etching said substrate using said film as an etching mask thereby forming said opening.

2. The method described in claim 1 wherein said substrate is selectively etched by an anisotropic etching process.

3. The method described in claim 2 wherein said film is a metal film and said substrate is selectively etched by a reactive ion etching process.

4. The method described in claim 3 wherein said film is evaporated MgO.

5. The method described in claim 3 wherein said film is evaporated polysilicon.

6. The method described in claim 1 wherein the top of said mesa is undercut prior to the deposition of said film.

7. The method described in claim 1 wherein said substrate is layered with the lowermost layer being doped polycrystalline silicon material formed on epitaxial silicon material.

8. The method described in claim 7 wherein said lowermost layer is P+-doped and said material is N-doped.

9. The method described in claim 1 wherein said film is deposited by evaporation.

10. The method described in claim 1 wherein the sidewalls of said mesa are selectively attacked by an isotropic etchant.

* * * * *